US011594564B2

(12) United States Patent
Fujii

(10) Patent No.: US 11,594,564 B2
(45) Date of Patent: Feb. 28, 2023

(54) SOLID-STATE IMAGING ELEMENT, MANUFACTURING METHOD, AND ELECTRONIC APPARATUS

(71) Applicant: SONY SEMICONDUCTOR SOLUTIONS CORPORATION, Kanagawa (JP)

(72) Inventor: Nobutoshi Fujii, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 293 days.

(21) Appl. No.: 16/759,901

(22) PCT Filed: Oct. 24, 2018

(86) PCT No.: PCT/JP2018/039408
§ 371 (c)(1),
(2) Date: Apr. 28, 2020

(87) PCT Pub. No.: WO2019/093122
PCT Pub. Date: May 16, 2019

(65) Prior Publication Data
US 2021/0183931 A1 Jun. 17, 2021

(30) Foreign Application Priority Data

Nov. 7, 2017 (JP) .............................. JP2017-214326

(51) Int. Cl.
*H01L 27/146* (2006.01)
*H04N 5/374* (2011.01)

(52) U.S. Cl.
CPC .. *H01L 27/14623* (2013.01); *H01L 27/14603* (2013.01); *H01L 27/14627* (2013.01); *H04N 5/374* (2013.01)

(58) Field of Classification Search
None
See application file for complete search history.

(56) References Cited

U.S. PATENT DOCUMENTS

2012/0062777 A1  3/2012  Kobayashi et al.
2014/0211056 A1* 7/2014  Fan .................. H01L 27/14634
                                             257/292
(Continued)

FOREIGN PATENT DOCUMENTS

CN   102629616 A  *  8/2012  ......... H01L 27/1461
CN   207731929 U  *  8/2018  ....... H01L 27/14612
(Continued)

OTHER PUBLICATIONS

International Search Report and Written Opinion of PCT Application No. PCT/JP2018/039408, dated Jan. 15, 2019, 09 pages of ISRWO.

*Primary Examiner* — Evren Seven
(74) *Attorney, Agent, or Firm* — Chip Law Group

(57) ABSTRACT

Provided is a solid-state imaging element, a manufacturing method, and an electronic apparatus which are capable of further improving a light-blocking effect. The solid-state imaging element has a laminated structure in which a memory substrate, a logic substrate, and a sensor substrate are laminated. The solid-state imaging element includes a through electrode that connects the memory substrate and the sensor substrate in a manner passing through a semiconductor layer of the logic substrate, and a light-blocking metal film arranged in a wiring layer included in the logic substrate and provided on the sensor substrate side, where the light-blocking metal film has an opening opened so as to allow the through electrode to pass through. The solid-state imaging element further includes a contact electrode formed on a bonded surface between the logic substrate and the (Continued)

sensor substrate and used to connect the through electrode to the sensor substrate side.

8 Claims, 12 Drawing Sheets

(56) References Cited

U.S. PATENT DOCUMENTS

| | | | |
|---|---|---|---|
| 2014/0231887 A1* | 8/2014 | Chen | H01L 27/14638 438/64 |
| 2014/0264947 A1* | 9/2014 | Lin | H01L 24/80 438/455 |
| 2015/0097258 A1 | 4/2015 | Shigetoshi | |
| 2018/0040658 A1* | 2/2018 | Kang | H01L 27/14627 |
| 2018/0286922 A1 | 10/2018 | Togashi | |

FOREIGN PATENT DOCUMENTS

| | | | | |
|---|---|---|---|---|
| EP | 3261123 A1 | 12/2017 | | |
| JP | 2012-064709 A | 3/2012 | | |
| JP | 2012-164870 A | 8/2012 | | |
| JP | 2013187360 A | * 9/2013 | ....... | H01L 27/14621 |
| JP | 2015-076502 A | 4/2015 | | |
| JP | 2016-511539 A | 4/2016 | | |
| JP | 2017-073436 A | 4/2017 | | |
| WO | 2014/120447 A1 | 8/2014 | | |
| WO | 2017/061082 A1 | 4/2017 | | |

* cited by examiner

SOLID-STATE IMAGING ELEMENT, MANUFACTURING METHOD, AND ELECTRONIC APPARATUS

CROSS REFERENCE TO RELATED APPLICATIONS

This application is a U.S. National Phase of International Patent Application No. PCT/JP2018/039408 filed on Oct. 24, 2018, which claims priority benefit of Japanese Patent Application No. JP 2017-214326 filed in the Japan Patent Office on Nov. 7, 2017. Each of the above-referenced applications is hereby incorporated herein by reference in its entirety.

TECHNICAL FIELD

The present disclosure relates to a solid-state imaging element, a manufacturing method, and an electronic apparatus, and particularly relates to a solid-state imaging element, a manufacturing method, and an electronic apparatus which are capable of further improving a light-blocking effect.

BACKGROUND ART

In recent years, a laminated solid-state imaging element obtained by vertically superimposing a complementary metal oxide semiconductor (CMOS) image sensor and substrates such as a logic circuit and a memory is widely utilized in an electronic apparatus such as a digital still camera or a digital video camera having an imaging function. For such a laminated solid-state imaging element, development has been made on a technology in which light blocking is provided between the respective substrates by utilizing a dummy pattern formed on a bonded surface at the time of bonding the substrates.

For example, in Patent Document 1, the development is made on a technology in which an entire surface is blocked from light by forming a dummy pattern on a bonded surface in a staggered lattice shape, and an adverse effect of light emission by hot carriers from a transistor is suppressed in a solid-state imaging element on which two substrates are laminated (for example, see Patent Document 1).

CITATION LIST

Patent Document

Patent Document 1: Japanese Patent Application Laid-Open No. 2012-164870

SUMMARY OF THE INVENTION

Problems to be Solved by the Invention

By the way, a through-silicon via (TSV) formed in a manner passing through a silicon substrate is sometimes utilized in a laminated solid-state imaging element in which three or more substrates are laminated. Although an above-described configuration disclosed in Patent Document 1 is applied to such a solid-state imaging element, there is a possibility that a gap provided around the TSV cannot be sufficiently blocked from light and the light passes through the gap and enters a CMOS image sensor.

The present disclosure is made in view of such a situation and directed to achieving further improvement on a light-blocking effect.

Solutions to Problems

A solid-state imaging element according to an aspect of the present disclosure includes: a through electrode that connects a first substrate side and a third substrate side in a manner passing through a semiconductor layer of a second substrate of a laminated structure in which the first substrate, the second substrate, and the third substrate are laminated; a light-blocking film arranged in a wiring layer included in the second substrate and provided on the third substrate side, and having an opening opened to allow the through electrode to pass through; and a contact electrode formed on a bonded surface between the second substrate and the third substrate and used to connect the through electrode to the third substrate side.

A manufacturing method according to an aspect of the present disclosure includes a manufacturing method performed by a manufacturing device that manufactures a solid-state imaging element including: a through electrode that connects a first substrate side and a third substrate side in a manner passing through a semiconductor layer of a second substrate of a laminated structure in which the first substrate, the second substrate, and the third substrate are laminated; a light-blocking film arranged in a wiring layer included in the second substrate and provided on the third substrate side, and having an opening opened to allow the through electrode to pass through; and a contact electrode formed on a bonded surface between the second substrate and the third substrate and used to connect the through electrode to the third substrate side, the manufacturing method including: bonding the first substrate and the second substrate; forming the wiring layer of the second substrate by: depositing an insulation film to be the wiring layer of the second substrate with a predetermined film thickness or less; and depositing the light-blocking film on an entire surface of the insulation film; and then depositing an insulation film until a predetermined film thickness is obtained; opening the opening in the light-blocking film, and forming the through electrode in a manner passing through the opening, and then forming the contact electrode on a surface of the wiring layer of the second substrate in a manner connected to the through electrode; and bonding the second substrate and the third substrate.

An electronic apparatus according to an aspect of the present disclosure includes a solid-state imaging element including: a solid-state imaging element having a laminated structure in which a first substrate, a second substrate, and a third substrate are laminated; a through electrode that connects the first substrate side and the third substrate side in a manner passing through a semiconductor layer of the second substrate; a light-blocking film arranged in a wiring layer included in the second substrate and provided on the third substrate side, and having an opening opened to allow the through electrode to pass through; and a contact electrode formed on a bonded surface between the second substrate and the third substrate and used to connect the through electrode to the third substrate side.

According to an aspect of the present disclosure, a first substrate side and a third substrate side are connected by a through electrode in a manner passing through a semiconductor layer of a second substrate of a laminated structure in which the first substrate, the second substrate, and the third substrate are laminated, a light-blocking film having an opening opened so as to allow the through electrode to pass through is arranged in a wiring layer included in the second substrate and provided on the third substrate side, and a contact electrode used to connect the through electrode to the third substrate side is formed on a bonded surface between the second substrate and the third substrate.

Effects of the Invention

According to an aspect of the present disclosure, a light-blocking effect can be further improved.

Note that the effect recited herein is not necessarily limited and may be any one of those recited in the present disclosure.

MODE FOR CARRYING OUT THE INVENTION

In the following, a specific embodiment to which the present technology is applied will be described in detail with reference to the drawings.

<First Exemplary Configuration of Solid-State Imaging Element>

Figure 1:
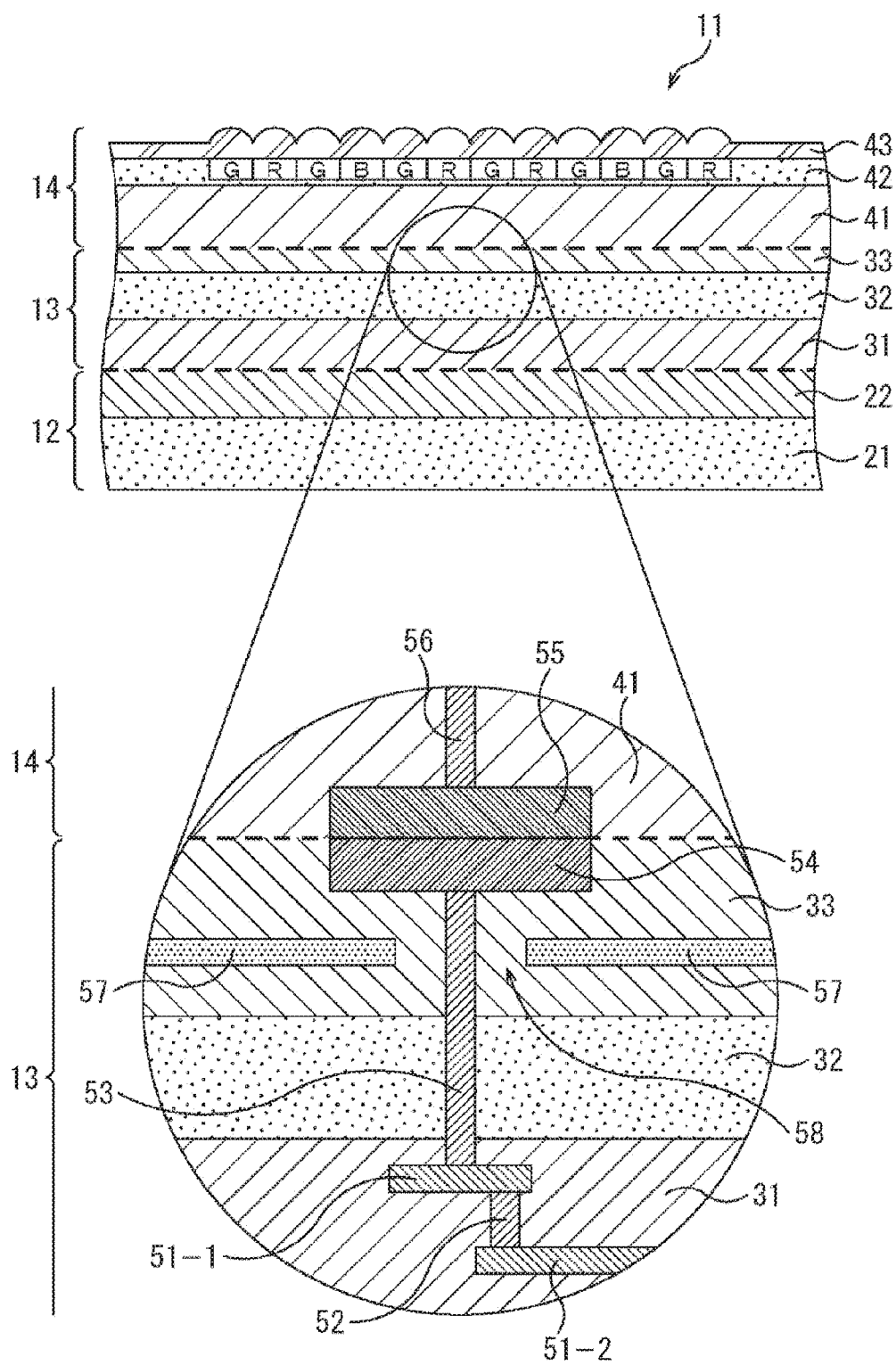
FIG. 1 is a cross-sectional view illustrating an exemplary configuration of a first embodiment of a solid-state imaging element to which the present technology is applied.

FIG. 1 is a view illustrating an exemplary configuration of a first embodiment of a solid-state imaging element to which the present technology is applied.

FIG. 1 illustrates a cross-sectional configuration of a laminated solid-state imaging element 11, and the solid-state imaging element 11 has a configuration obtained by laminating three layers including a memory substrate 12, a logic substrate 13, and a sensor substrate 14 as illustrated. Furthermore, broken lines illustrated in the drawing represent bonded surfaces between the respective substrates.

The memory substrate 12 is formed by laminating, on a semiconductor layer 21 on which a plurality of semiconductor elements that drives a memory is formed, a wiring layer 22 on which wiring utilized to connect the semiconductor elements to the logic substrate 13 and the sensor substrate 14 is formed.

The logic substrate 13 has a configuration obtained by laminating: a wiring layer 31 on which wiring utilized for connection to the memory substrate 12 side is formed; a semiconductor layer 32 on which a semiconductor element that drives the logic circuit is formed; and a wiring layer 33 on which wiring utilized for connection to the semiconductor layer 32 side is formed.

The sensor substrate 14 has a configuration obtained by laminating: a wiring layer 41 on which wiring utilized to connect the memory substrate 12 and the logic substrate 13 is formed; a semiconductor layer 42 on which a photodiode or a semiconductor element constituting a pixel is formed; and an on-chip lens layer 43 on which a microlens that condenses light per pixel is formed.

Furthermore, a structure of the bonded surface between the logic substrate 13 and the sensor substrate 14 is illustrated in an enlarged manner on the lower side of FIG. 1.

As illustrated, a plurality of layers of wiring 51 (two layers of wiring 51-1 and 51-2 in the example of FIG. 1) is arranged in the wiring layer 31 of the logic substrate 13, and the layers of wiring 51 are connected by an electrode 52. Then, the wiring 51-1 and a contact electrode 54 are connected by a through electrode 53 formed in a manner passing through the semiconductor layer 32 of the logic substrate 13.

The contact electrode 54 is formed on a surface of the wiring layer 33 of the logic substrate 13, that is, the bonded surface between the logic substrate 13 and the sensor substrate 14, and is used to connect the through electrode 53 to the sensor substrate 14 side. Then, the contact electrode 54 is bonded (for example, a Cu—Cu bonded) to the contact electrode 55 formed on the bonded surface on the sensor substrate 14 side. Furthermore, the contact electrode 55 is connected to, for example, an electrode 56 that provides connection to the pixel provided on the sensor substrate 14.

Additionally, the solid-state imaging element 11 has a configuration in which a light-blocking metal film 57 is formed in the wiring layer 33 of the logic substrate 13. The light-blocking metal film 57 is formed by, for example, depositing a metal having a light-blocking effect, such as aluminum, titanium, tungsten, copper, or tantalum, and a portion where the through electrode 53 is formed is opened by an opening 58. That is, the through electrode 53 passes through the opening 58 formed in the light-blocking metal film 57 to connect the wiring 51-1 and the contact electrode 54.

Furthermore, the light-blocking metal film 57 is deposited in a manner covering an entire surface excluding the portion where the through electrode 53 is formed in a plan view of the solid-state imaging element 11. Moreover, the opening 58 formed in the light-blocking metal film 57 is formed in a manner such that an open diameter is smaller than the contact electrode 54 in the plan view of the solid-state imaging element 11. That is, the contact electrode 54 is formed so as to have a shape larger than the opening 58 in the plan view of the solid-state imaging element 11.

Since the light-blocking metal film 57 is provided, the solid-state imaging element 11 thus configured can prevent the light from entering the sensor substrate 14 from the logic substrate 13, and the light-blocking effect can be more improved than in the conventional art. For example, the solid-state imaging element 11 blocks, by the light-blocking metal film 57, light caused by hot carriers generated when a semiconductor element such as the memory substrate 12 or the logic substrate 13 is driven, and it is possible to avoid such light from giving an adverse effect given to the pixel of the sensor substrate 14.

In particular, since the contact electrode 54 having the shape larger than the opening 58 of the light-blocking metal film 57 is provided, the solid-state imaging element 11 can block the light by the contact electrode 54 even when, for example, the light which may pass through a gap between the through electrode 53 and the light-blocking metal film 57 is emitted. With this configuration, it is possible to prevent the light from directly entering the sensor substrate 14 from the logic substrate 13.

That is, the solid-state imaging element 11 can improve the light-blocking effect with such a contact electrode 54 more than in a configuration in which only the light-blocking metal film 57 is provided. Furthermore, for example, a through electrode cannot be used in a structure in which a metal layer is arranged on an entire surface in order to provide a light-blocking effect, whereas the through electrode 53 can be used in the solid-state imaging element 11.

<Second to Eighth Exemplary Configurations of Solid-state Imaging Element>

Second to eighth exemplary configurations of the solid-state imaging element 11 will be described with reference to FIG. 2 to FIG. 8. Note that a configuration common with the solid-state imaging element 11 of FIG. 1 will be denoted by the same reference sign in solid-state imaging elements 11A to 11G described below, and a detailed description thereof will be omitted.

That is, similarly to the solid-state imaging element 11 of FIG. 1, the solid-state imaging elements 11A to 11G are the laminated type in which the memory substrate 12, the logic substrate 13, and the sensor substrate 14 are laminated, and the through electrode 53 is formed in a manner passing through the semiconductor layer 32 of the logic substrate 13. Furthermore, also in the solid-state imaging elements 11A to 11G, the light-blocking metal film 57 having the opening 58 provided to allow the through electrode 53 to pass through is arranged in the wiring layer 33 included in the logic substrate 13 and provided on the sensor substrate 14 side.

Figure 2:
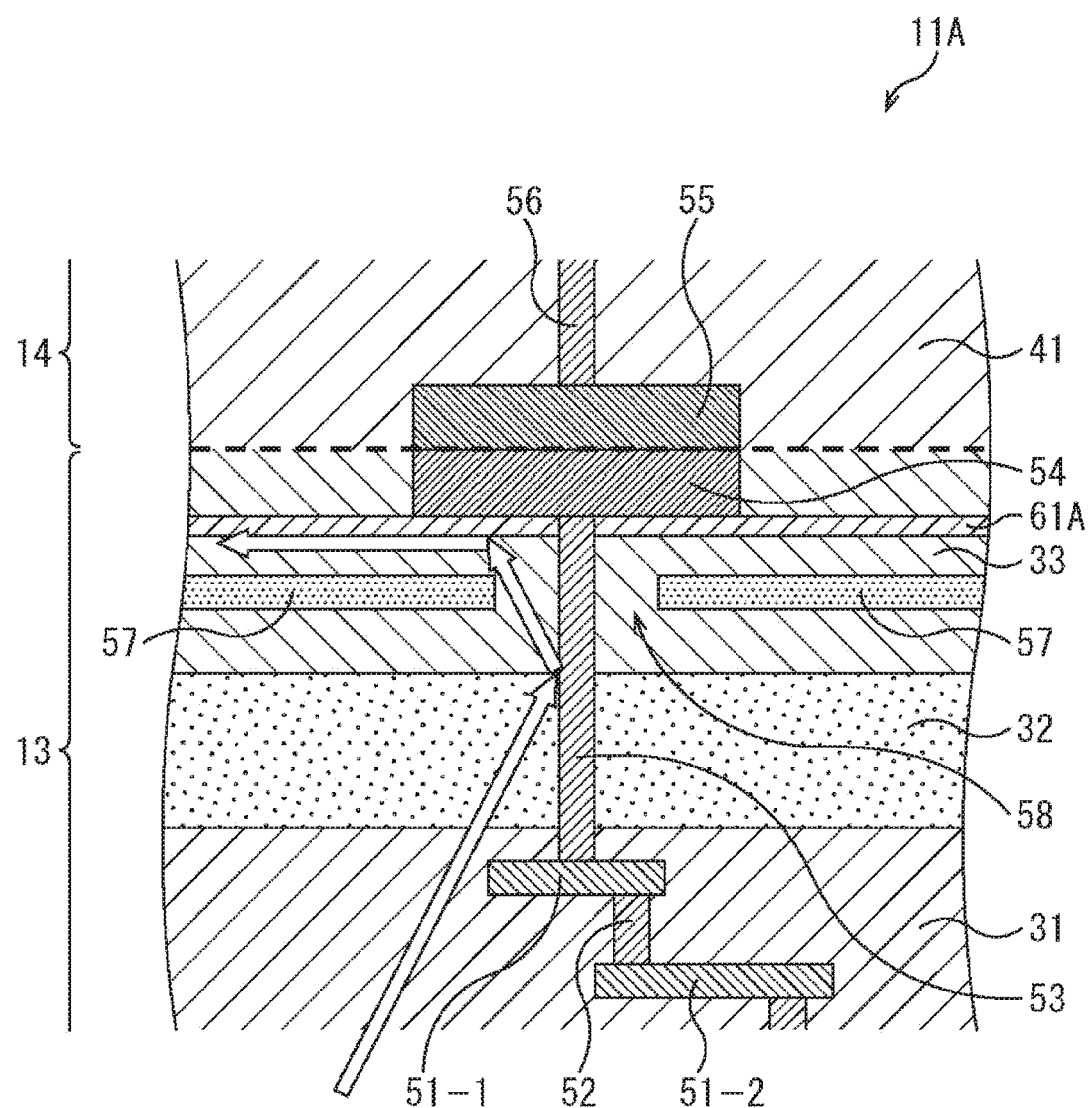
FIG. 2 is a cross-sectional view illustrating a second exemplary configuration of the solid-state imaging element.

FIG. 2 illustrates a cross-sectional configuration of the bonded surface between the logic substrate 13 and the sensor substrate 14 of a solid-state imaging element 11A that is the second exemplary configuration.

As illustrated in FIG. 2, the solid-state imaging element 11A has a configuration in which an insulation film 61A having a refractive index different from that of the wiring layer 33 is deposited between the light-blocking metal film 57 and the contact electrode 54. For example, a material having a low refractive index is selected for the insulation film 61A such that a refractive index n2 of the insulation film 61A becomes lower than a refractive index n1 of a silicon dioxide (SiO2) constituting an interlayer insulation film of the wiring layer 33 (n2<n1). Furthermore, in the example illustrated in FIG. 2, the insulation film 61A is arranged at a position that is in contact with the contact electrode 54, but it is sufficient that the insulation film 61A is arranged at any position closer to the contact electrode 54 side than the light-blocking metal film 57.

In the solid-state imaging element 11A thus configured, the light having passed through the gap between the through electrode 53 and the light-blocking metal film 57 from the logic substrate 13 side can be totally reflected at an interface between the wiring layer 33 and the insulation film 61A. That is, the solid-state imaging element 11A has the insulation film 61A formed such that the light having passed through the gap between the through electrode 53 and the light-blocking metal film 57 can be totally reflected in a direction toward a side surface of the solid-state imaging element 11A as indicated by white arrows in FIG. 2. With this configuration, the light having passed through the gap between the through electrode 53 and the light-blocking metal film 57 can be prevented from entering the sensor substrate 14 in the solid-state imaging element 11A.

Therefore, since the insulation film 61A having the refractive index different from that of the wiring layer 33 is provided, the solid-state imaging element 11A can reliably prevent the light from entering the sensor substrate 14 from the logic substrate 13, and the light-blocking effect can be more improved than in the solid-state imaging element 11 of FIG. 1.

Figure 3:
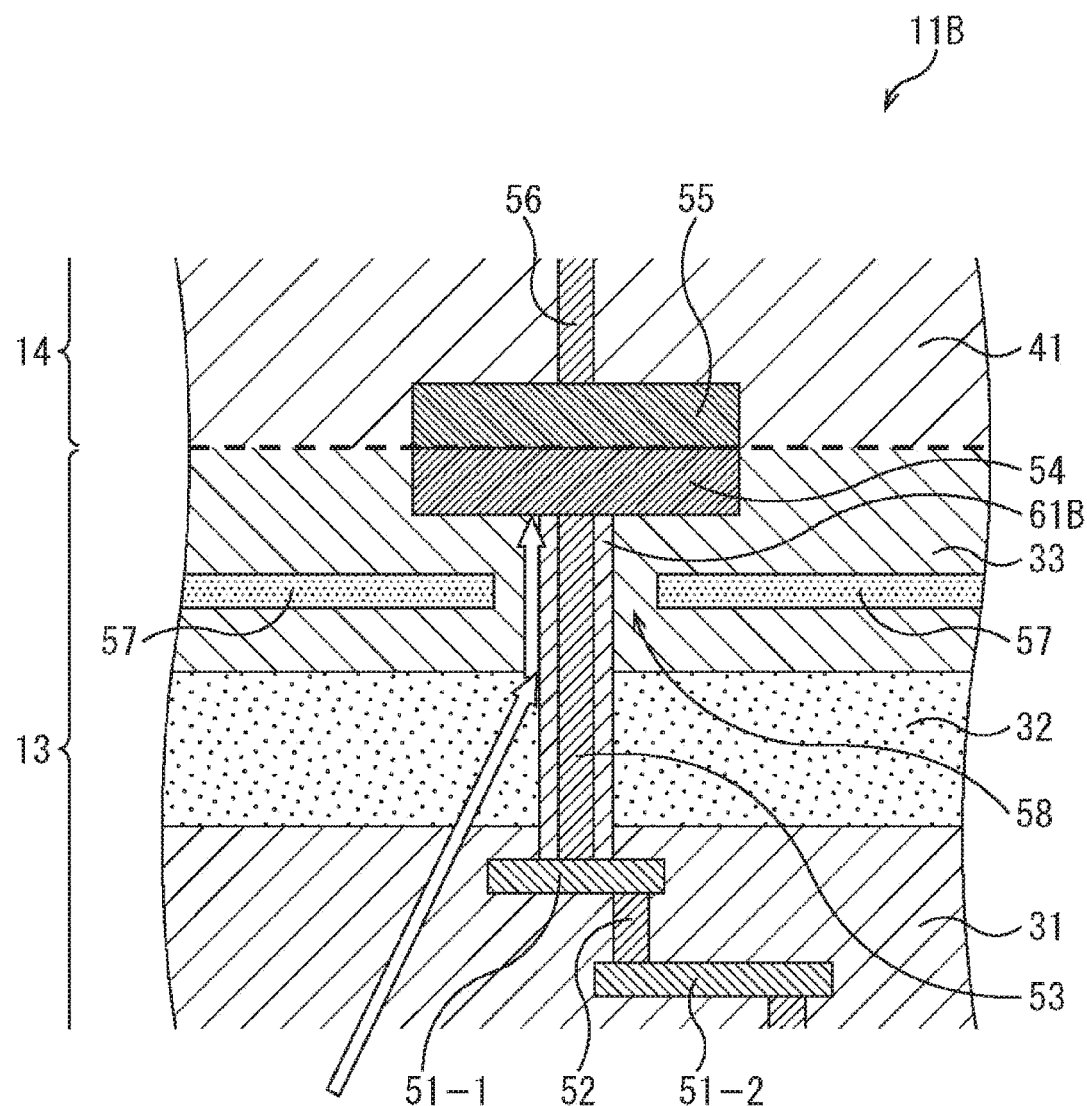
FIG. 3 is a cross-sectional view illustrating a third exemplary configuration of the solid-state imaging element.

Next, FIG. 3 illustrates a cross-sectional configuration of the bonded surface between the logic substrate 13 and the sensor substrate 14 of a solid-state imaging element 11B that is the third exemplary configuration.

As illustrated in FIG. 3, the solid-state imaging element 11B has a configuration in which an insulation film 61B is deposited in a manner covering a side surface of the through electrode 53. Similarly to the insulation film 61A of FIG. 2, the material having the low refractive index is selected for the insulation film 61B.

In the solid-state imaging element 11B thus configured, the light directed toward the through electrode 53 from the oblique direction can be totally reflected at an interface between the wiring layer 33 and the insulation film 61B. In other words, the solid-state imaging element 11B has the insulation film 61B formed such that the light directed toward the through electrode 53 from the oblique direction can be completely reflected toward the contact electrode 54 along a longitudinal direction of the through electrode 53 as indicated by white arrows in FIG. 3. The light is reflected at the contact electrode 54 and returned to the logic substrate 13 side and can be prevented from entering the sensor substrate 14.

Therefore, since the insulation film 61B having the refractive index different from that of the wiring layer 33 is provided, the solid-state imaging element 11B can reliably prevent the light from entering the sensor substrate 14 from the logic substrate 13, and the light-blocking effect can be more improved than in the solid-state imaging element 11 of FIG. 1.

Figure 4:
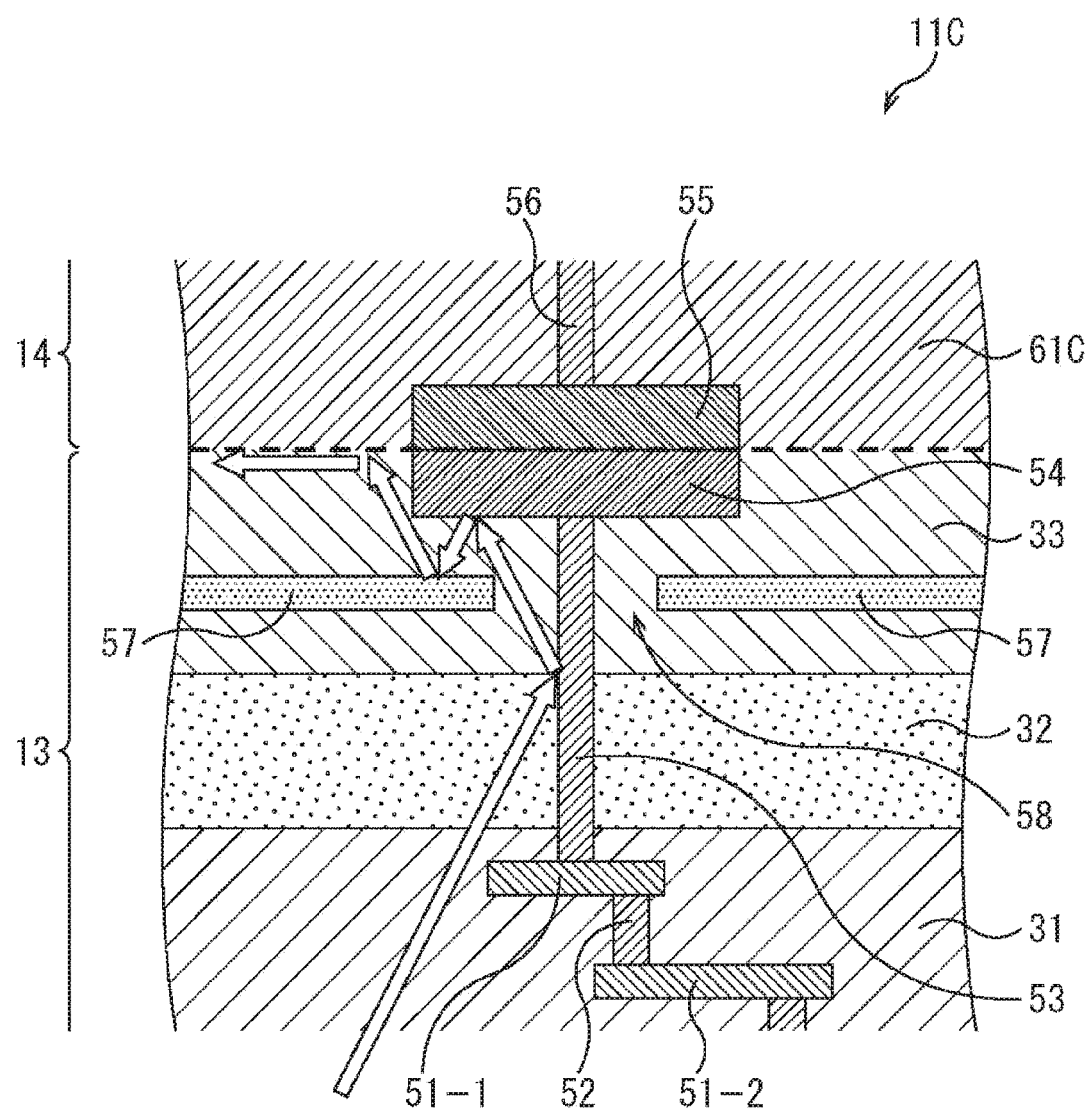
FIG. 4 is a cross-sectional view illustrating a fourth exemplary configuration of the solid-state imaging element.

Next, FIG. 4 illustrates a cross-sectional configuration of the bonded surface between the logic substrate 13 and the sensor substrate 14 of a solid-state imaging element 11C that is the fourth exemplary configuration.

As illustrated in FIG. 4, the solid-state imaging element 11C has a configuration in which an insulation film 61C having a refractive index different from that of the wiring layer 33 to be a bonded surface on the logic substrate 13 side is used as a bonded surface on the sensor substrate 14 side. Similarly to the insulation film 61A of FIG. 2, the material having the low refractive index is selected for the insulation film 61C. That is, the insulation film 61C is provided on the sensor substrate 14 side of the bonded surface between the logic substrate 13 and the sensor substrate 14.

In the solid-state imaging element 11C thus configured, the light having passed through the gap between the through electrode 53 and the light-blocking metal film 57 from the logic substrate 13 side can be totally reflected at an interface between the wiring layer 33 and the insulation film 61C, that is, the bonded surface between the logic substrate 13 and the sensor substrate 14. That is, the solid-state imaging element 11C has the insulation film 61C formed such that the light having passed through the gap between the through electrode 53 and the light-blocking metal film 57 can be totally reflected in a direction toward a side surface of the solid-state imaging element 11C as indicated by white arrows in FIG. 4. With this configuration, the light having passed through the gap between the through electrode 53 and the light-blocking metal film 57 can be prevented from entering the sensor substrate 14 in the solid-state imaging element 11C.

Therefore, since the insulation film 61C having the refractive index different from that of the wiring layer 33 is provided, the solid-state imaging element 11C can reliably prevent the light from entering the sensor substrate 14 from the logic substrate 13, and the light-blocking effect can be more improved than in the solid-state imaging element 11 of FIG. 1.

Figure 5:
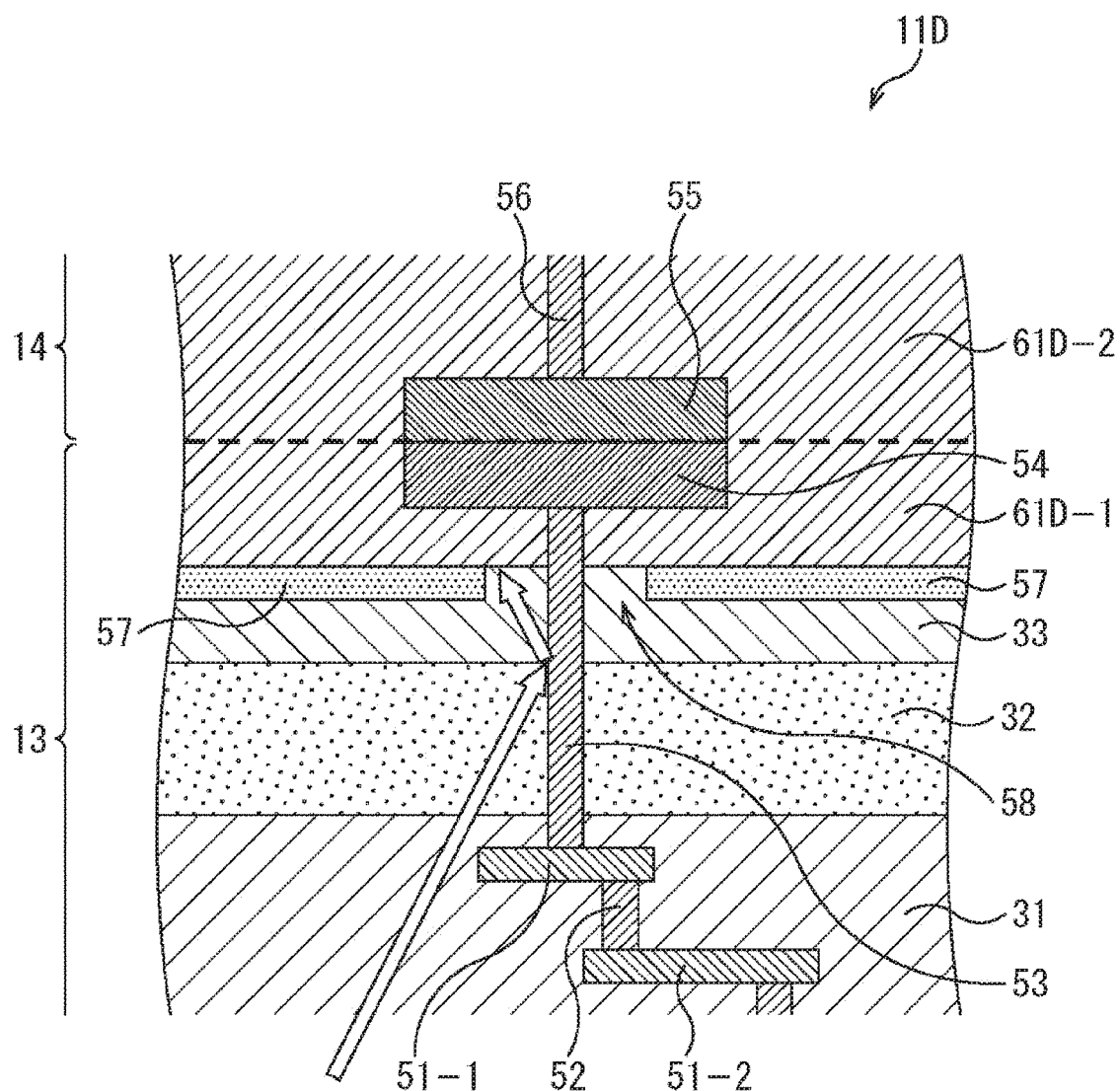
FIG. 5 is a cross-sectional view illustrating a fifth exemplary configuration of the solid-state imaging element.

Next, FIG. 5 illustrates a cross-sectional configuration of the bonded surface between the logic substrate 13 and the sensor substrate 14 of a solid-state imaging element 11D that is the fifth exemplary configuration.

As illustrated in FIG. 5, the solid-state imaging element 11D has a configuration in which an insulation film 61D-1 having a refractive index different from that of the wiring layer 33 is used at a place closer to the sensor substrate 14 side than the light-blocking metal film 57, and an interface between the wiring layer 33 and the insulation film 61D-1 is provided in a gap between the through electrode 53 and the light-blocking metal film 57. Furthermore, an insulation film 61D-2 having a refractive index same as that of the insulation film 61D-1 is used also on the bonded surface on the sensor substrate 14 side. Similarly to the insulation film 61A of FIG. 2, the material having the low refractive index is selected for the insulation films 61D-1 and 61D-2. That is, the insulation film 61D is provided on the sensor substrate 14 side with respect to the light-blocking metal film 57 in a manner laminated on the light-blocking metal film 57.

In the solid-state imaging element 11D thus configured, the light directed from the logic substrate 13 side to the gap between the through electrode 53 and the light-blocking metal film 57 can be totally reflected at the interface between the wiring layer 33 and the insulation film 61D. That is, the solid-state imaging element 11D has the insulation film 61D formed such that the light directed to the gap between the through electrode 53 and the light-blocking metal film 57 can be totally reflected in a direction toward a side surface of the solid-state imaging element 11D as indicated by white arrows in FIG. 5. With this configuration, the light having directed to the gap between the through electrode 53 and the light-blocking metal film 57 can be prevented from entering the sensor substrate 14 in the solid-state imaging element 11D.

Therefore, since the insulation film 61D having the refractive index different from that of the wiring layer 33 is provided, the solid-state imaging element 11D can reliably prevent the light from entering the sensor substrate 14 from the logic substrate 13, and the light-blocking effect can be more improved than in the solid-state imaging element 11 of FIG. 1.

Figure 6:
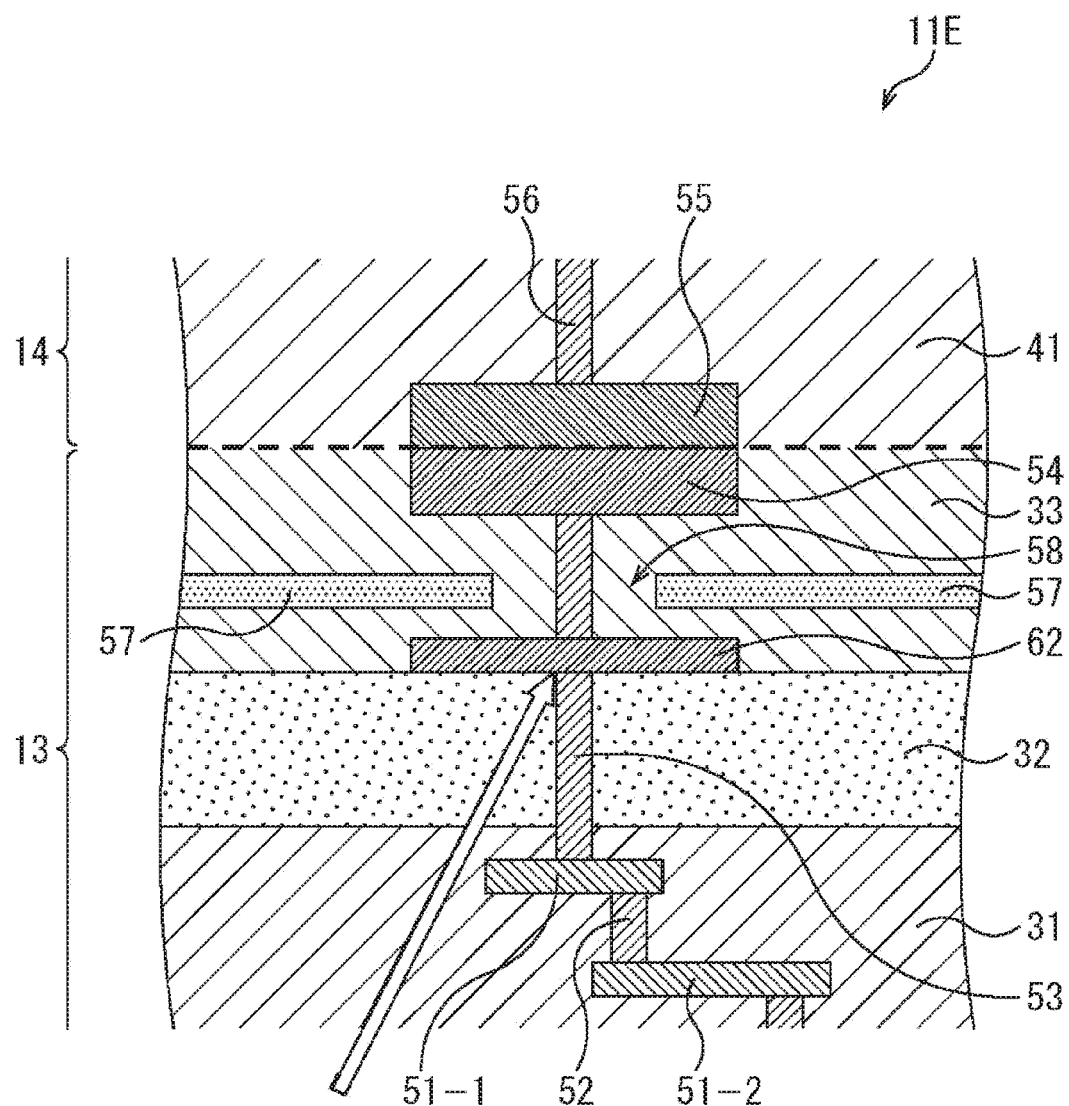
FIG. 6 is a cross-sectional view illustrating a sixth exemplary configuration of the solid-state imaging element.

Next, FIG. 6 illustrates a cross-sectional configuration of the bonded surface between the logic substrate 13 and the sensor substrate 14 of a solid-state imaging element 11E that is the sixth exemplary configuration.

As illustrated in FIG. 6, the solid-state imaging element 11E has a configuration in which a light-blocking electrode 62 is provided at a portion where the through electrode 53 is formed on a surface included in the semiconductor layer 32 of the logic substrate 13 and facing the sensor substrate 14 side, and the light-blocking electrode 62 has a shape larger than the opening 58 formed in the light-blocking metal film 57. For example, the light-blocking electrode 62 is formed in a size substantially same as the contact electrode 54 in the plan view of the solid-state imaging element 11. Furthermore, the through electrode 53 of the solid-state imaging element 11E has a configuration of connecting the wiring 51-1 and the contact electrode 54 via the light-blocking electrode 62.

The solid-state imaging element 11E thus configured can block, by the light-blocking electrode 62, the light directed from the logic substrate 13 side to the gap between through electrode 53 and the light-blocking metal film 57. That is, the solid-state imaging element 11E has the light-blocking electrode 62 formed so as to block the light directed to the gap between the through electrode 53 and the light-blocking metal film 57 as indicated by a white arrow in FIG. 6. With this configuration, the light having directed to the gap between the through electrode 53 and the light-blocking metal film 57 can be prevented from entering the sensor substrate 14 in the solid-state imaging element 11E.

Therefore, since double light-blocking configuration is provided in a manner interposing the opening 58 between the contact electrode 54 and the light-blocking electrode 62, the solid-state imaging element 11E can reliably prevent the light from entering the sensor substrate 14 from the logic substrate 13, and the light-blocking effect can be more improved than in the solid-state imaging element 11 of FIG. 1.

Figure 7:
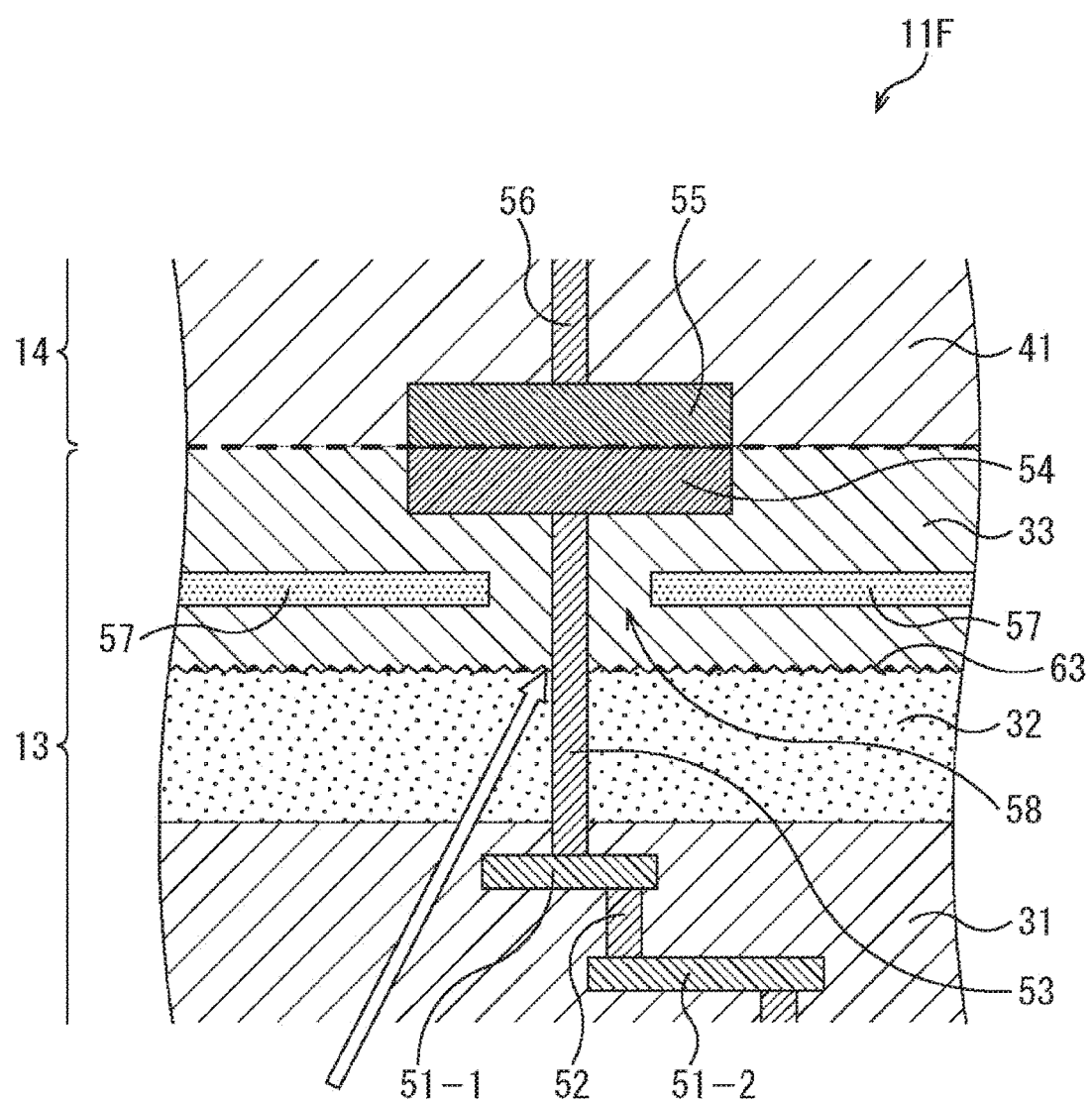
FIG. 7 is a cross-sectional view illustrating a seventh exemplary configuration of the solid-state imaging element.

Next, FIG. 7 illustrates a cross-sectional configuration of the bonded surface between the logic substrate 13 and the sensor substrate 14 of a solid-state imaging element 11F that is the seventh exemplary configuration.

As illustrated in FIG. 7, the solid-state imaging element 11F has a configuration in which a moth-eye structure 63 including a pattern on a surface facing the sensor substrate 14 side and included in the semiconductor layer 32 of the logic substrate 13, and the pattern includes fine irregularities provided at regular intervals. For example, the moth-eye structure 63 can prevent light reflection, can diffuse light, and the like.

The solid-state imaging element 11F thus configured can prevent, by the moth-eye structure 63, transmission of the light directed from the logic substrate 13 side to the gap between the through electrode 53 and the light-blocking metal film 57. That is, the solid-state imaging element 11F has the moth-eye structure 63 formed so as to prevent the transmission of the light directed to the gap between the through electrode 53 and the light-blocking metal film 57 as indicated by a white arrow in FIG. 7. With this configuration, the light having directed to the gap between the through electrode 53 and the light-blocking metal film 57 can be prevented from entering the sensor substrate 14 in the solid-state imaging element 11F.

Therefore, since the moth-eye structure 63 is provided, the solid-state imaging element 11F can reliably prevent the light from entering the sensor substrate 14 from the logic substrate 13, and the light-blocking effect can be more improved than in the solid-state imaging element 11 of FIG. 1.

Figure 8:
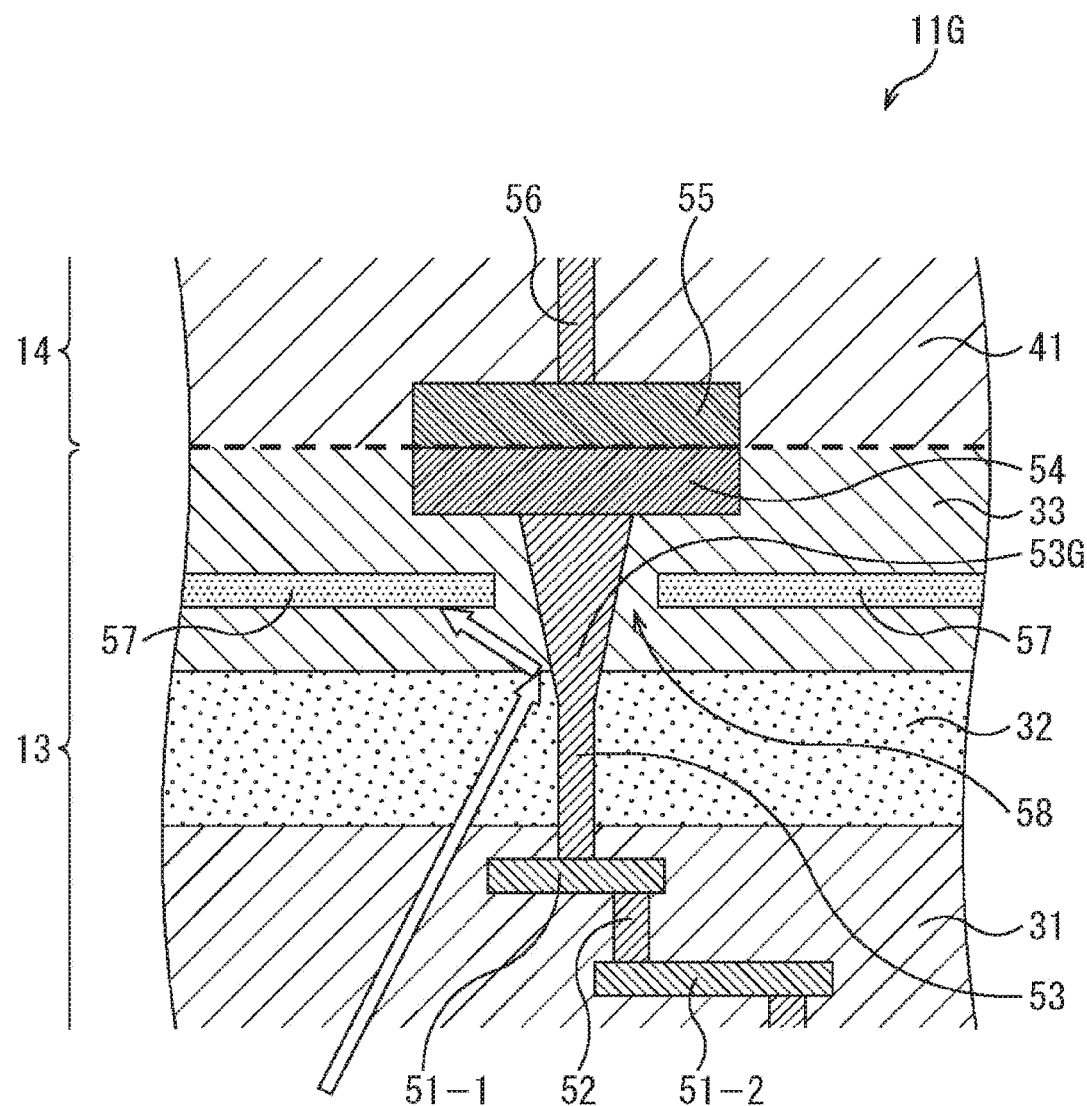
FIG. 8 is a cross-sectional view illustrating an eighth exemplary configuration of the solid-state imaging element.

Next, FIG. 8 illustrates a cross-sectional configuration of the bonded surface between the logic substrate 13 and the sensor substrate 14 of a solid-state imaging element 11G that is the eighth exemplary configuration.

As illustrated in FIG. 8, the solid-state imaging element 11G has a configuration in which a through electrode 53G passing through the semiconductor layer 32 of the logic substrate 13 is formed in a tapered shape having a diameter broadened toward the sensor substrate 14.

In the solid-state imaging element 11G thus configured, light directed toward the through electrode 53G from an oblique direction can be reflected in a direction in which the light is prevented from being directed to the gap between the through electrode 53 and the light-blocking metal film 57. That is, the solid-state imaging element 11G has the through electrode 53G formed in the tapered shape so as to reflect, toward a surface of the light-blocking metal film 57, the light directed toward the through electrode 53G from the oblique direction as indicated by white arrows in FIG. 8. The light is reflected at the light-blocking metal film 57 and directed in a direction of a side surface of the logic substrate 13, and the light can be prevented from entering the sensor substrate 14.

Therefore, since the tapered through electrode 53G is provided, the solid-state imaging element 11G can reliably prevent the light from entering the sensor substrate 14 from the logic substrate 13, and the light-blocking effect can be more improved than in the solid-state imaging element 11 of FIG. 1.

For example, it is proved that light emission from the memory substrate 12 and the logic substrate 13 is caused by hot carriers during operation of a device, and light from the lower layer side of the sensor substrate 14 is generated from vicinities of transistors provided on the memory substrate 12 and the logic substrate 13. Therefore, a direction of this light source is a direction on the transistors side from the view of the tapered through electrode 53G, and an incident angle to a periphery of the tapered through electrode 53G is dependent on a positional relation with each of the transistors with respect to the tapered through electrode 53G.

Due to this, a tapered angle of the tapered through electrode 53G is set such that the light-blocking metal film 57 is located in a direction of a reflection angle with respect to the incident angle. That is, when a center axis of the tapered through electrode 53G is defined as a reference in a vertical direction, the light from a transistor is reflected on a side surface of the tapered through electrode 53G at a reflection angle ($\theta+2\varphi$) with respect to the center axis of the tapered through electrode 53G on the basis of an angle $\theta$ formed by the direction (incident direction) from the transistor to the tapered through electrode 53G and an angle $\varphi$ of the side surface of the tapered through electrode 53G.

Therefore, since the light-blocking metal film 57 is formed with the opening 58 so as to have the angle $2\varphi$ or less from the center of the tapered through electrode 53G, dependent on a height from the transistor to the light-blocking metal film 57, the light from the transistor can be blocked.

As described above, the solid-state imaging element 11 and the solid-state imaging elements 11A to 11D are the laminated type in which the memory substrate 12, the logic substrate 13, and the sensor substrate 14 are laminated, and the light-blocking effect can be more improved even in the structure in which electric connection is provided by the through electrode 53. With this configuration, for example, light caused by hot carriers generated in a semiconductor element such as the memory substrate 12 or the logic substrate 13 is blocked, and such light does not give any adverse effect to a pixel of the sensor substrate 14.

Note that the solid-state imaging element 11 may have a configuration in which a light-absorbing film having a property of absorbing light is deposited instead of the light-blocking metal film 57, and the light is blocked by the light-absorbing film. Furthermore, the solid-state imaging element 11 may have a laminated structure having three or more layers including the memory substrate 12, the logic substrate 13, and the sensor substrate 14.

<Manufacturing Method of Solid-State Imaging Element>

Next, a manufacturing method of the solid-state imaging element 11 in FIG. 1 will be described with reference to FIGS. 9 and 10.

Figure 9:
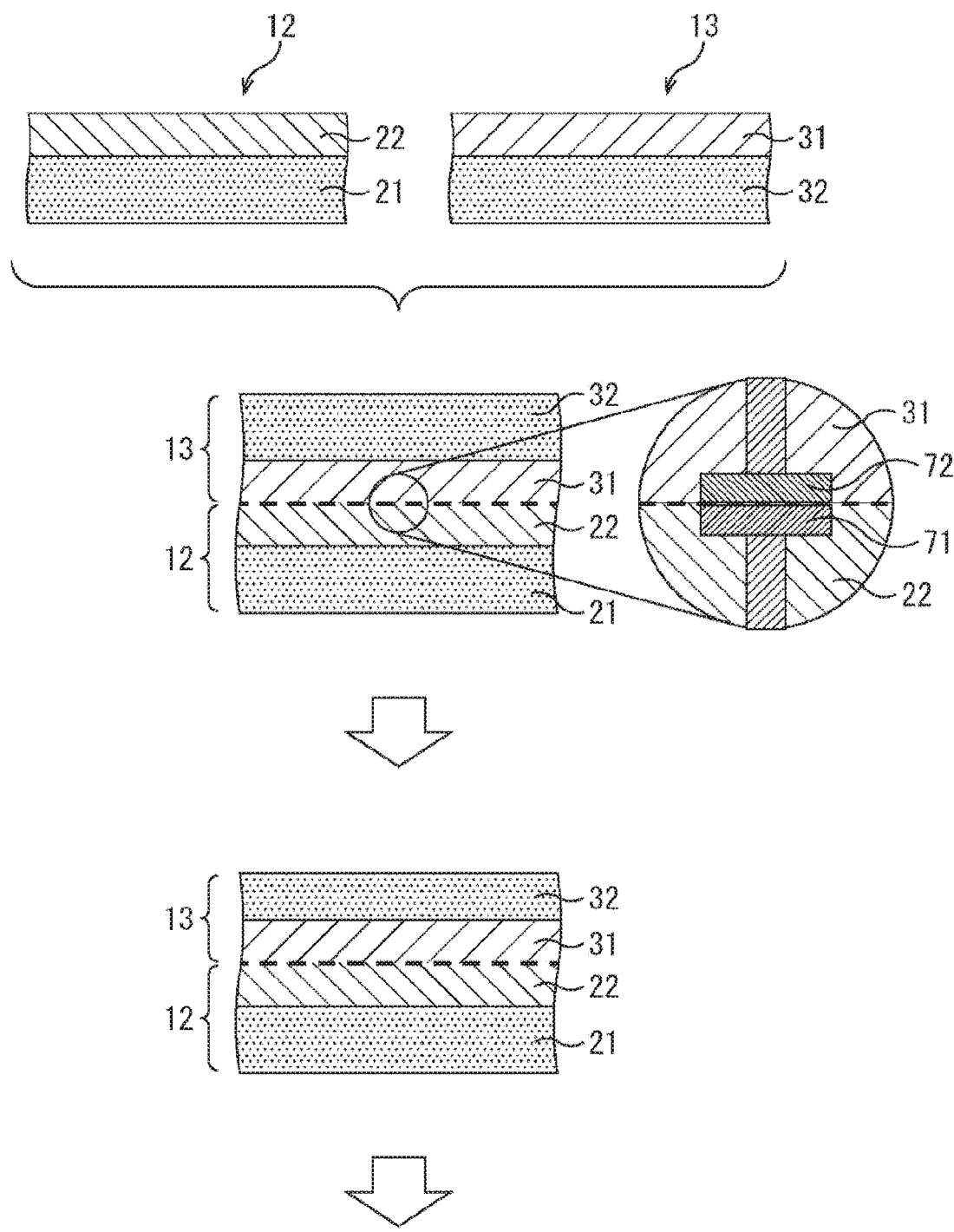
FIG. 9 is a diagram to describe a manufacturing method of the solid-state imaging element.

Initially, in a first step, the memory substrate 12 and the logic substrate 13 that have been separately manufactured are bonded by hybrid bonding as illustrated in an upper part of FIG. 9. For example, an insulation film of the wiring layer 22 and an insulation film of the wiring layer 31 are bonded to each other, and a contact electrode 71 formed on a surface of the wiring layer 22 and a contact electrode 72 formed on a surface of the wiring layer 31 are bonded (for example, Cu—Cu bonded) as illustrated FIG. 9 in an enlarged manner.

Furthermore, in a second step, a film thickness of the semiconductor layer 32 of the logic substrate 13 is thinned by, for example, chemical mechanical polishing (CMP) or the like as illustrated in a lower part of FIG. 9.

Figure 10:
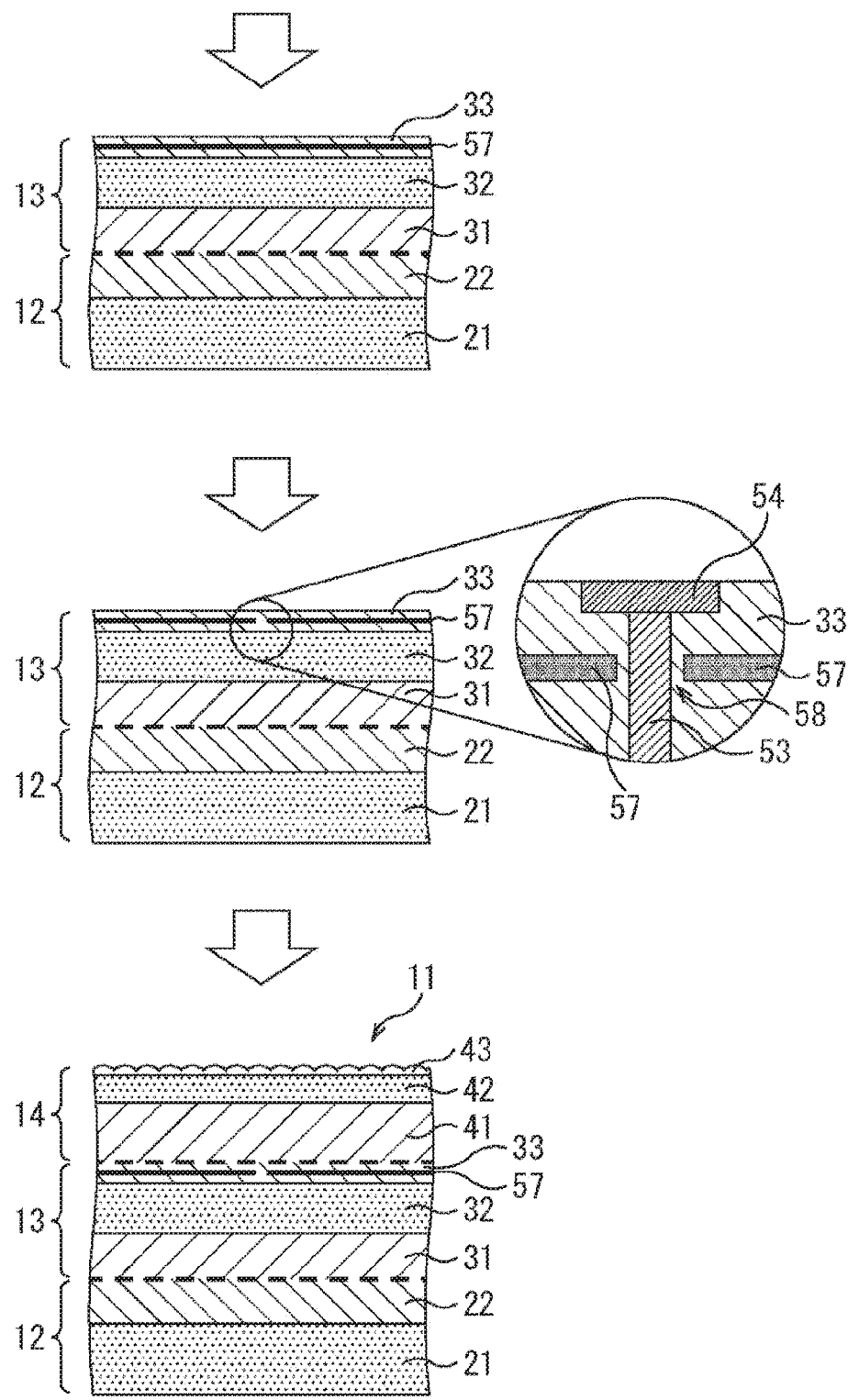
FIG. 10 is a diagram to describe the manufacturing method of the solid-state imaging element.

Next, in a third step, an insulation film to be the wiring layer 33 having a predetermined film thickness or less is deposited on the semiconductor layer 32, and the light-blocking metal film 57 is deposited on an entire surface of the insulation film as illustrated in a first stage of FIG. 10. Thereafter, the wiring layer 33 having the light-blocking metal film 57 interposed is formed by depositing an insulation film on the light-blocking metal film 57 until a predetermined film thickness is obtained.

Furthermore, in a fourth step, the through electrode 53 is formed in a manner connected to the semiconductor layer 32, and also the contact electrode 54 is formed on the surface of the wiring layer 33 in a manner connected to the through electrode 53 as illustrated in a second stage of FIG. 10. Here, when the through electrode 53 is formed, the opening 58 is processed in the light-blocking metal film 57 so as to have the open diameter smaller than the contact electrode 54, and the through electrode 53 is formed in a manner passing through the opening 58.

Then, in a fifth step, the sensor substrate 14 is bonded to the logic substrate 13 as illustrated in a third stage of FIG. 10. For example, as illustrated in FIG. 1, the contact electrode 54 of the logic substrate 13 and the contact electrode 55 of the sensor substrate 14 are bonded (for example, Cu—Cu bonded).

Using a manufacturing device that performs the above-described steps, it is possible to manufacture the solid-state imaging element 11 including the light-blocking metal film 57 that prevents light from entering the sensor substrate 14 from the logic substrate 13 and can improve the light-blocking effect. Note that the above-described solid-state imaging elements 11A to 11G can also be manufactured by steps similar to those of the solid-state imaging element 11.

<Exemplary Configuration of Electronic Apparatus>

Note that the laminated solid-state imaging element 11 as described above is applicable to, for example, various kinds of electronic apparatuses such as an imaging system like a digital still camera or a digital video camera, a mobile phone having an imaging function, or other apparatuses each including an imaging function.

Figure 11:
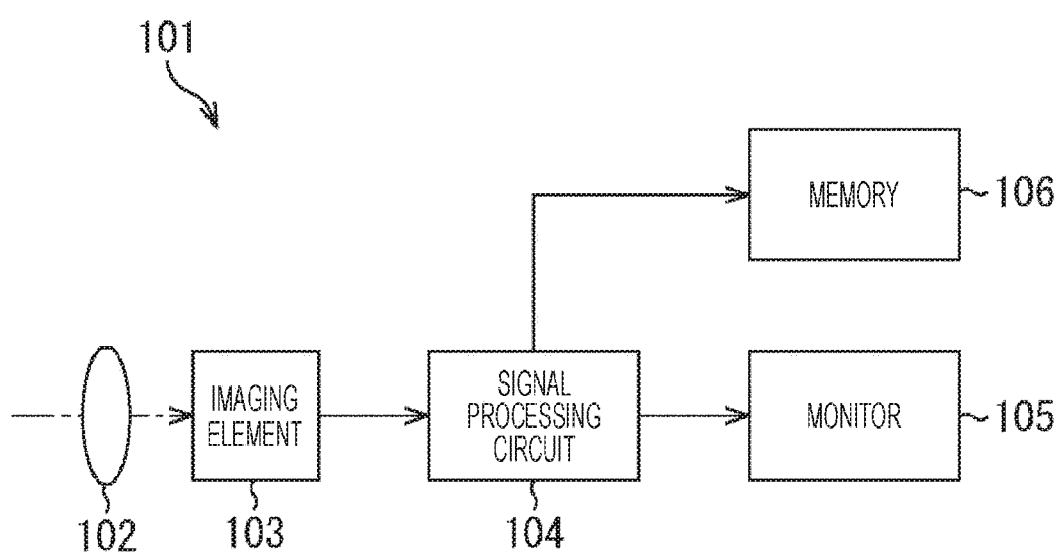
FIG. 11 is a block diagram illustrating an exemplary configuration of an imaging device.

FIG. 11 is a block diagram illustrating an exemplary configuration of an imaging device mounted on an electronic apparatus.

As illustrated in FIG. 11, an imaging device 101 includes an optical system 102, an imaging element 103, a signal processing circuit 104, a monitor 105, and a memory 106, and is capable of capturing still images and moving images.

The optical system 102 includes one or a plurality of lenses, and guides light (incident light) from a subject to the imaging element 103, and forms an image on a light-receiving surface (sensor portion) of the imaging element 103.

As the imaging element 103, the solid-state imaging element 11 described above is applied. In the imaging element 103, electrons are accumulated for a predetermined period in accordance with an image formed on the light-receiving surface via the optical system 102. Then, a signal according to the electrons accumulated in the imaging element 103 is supplied to the signal processing circuit 104.

The signal processing circuit 104 applies various kinds of signal processing to a pixel signal output from the imaging element 103. An image (image data) obtained by the signal processing circuit 104 applying the signal processing is supplied and displayed on the monitor 105, and/or supplied and stored (recorded) in the memory 106.

In the imaging device 101 thus configured, the above-described laminated solid-state imaging element 11 is applied, and therefore, a high-quality image having no adverse effect from light caused by, for example, hot carriers can be captured.

<Exemplary Uses of Image Sensor>

Figure 12:
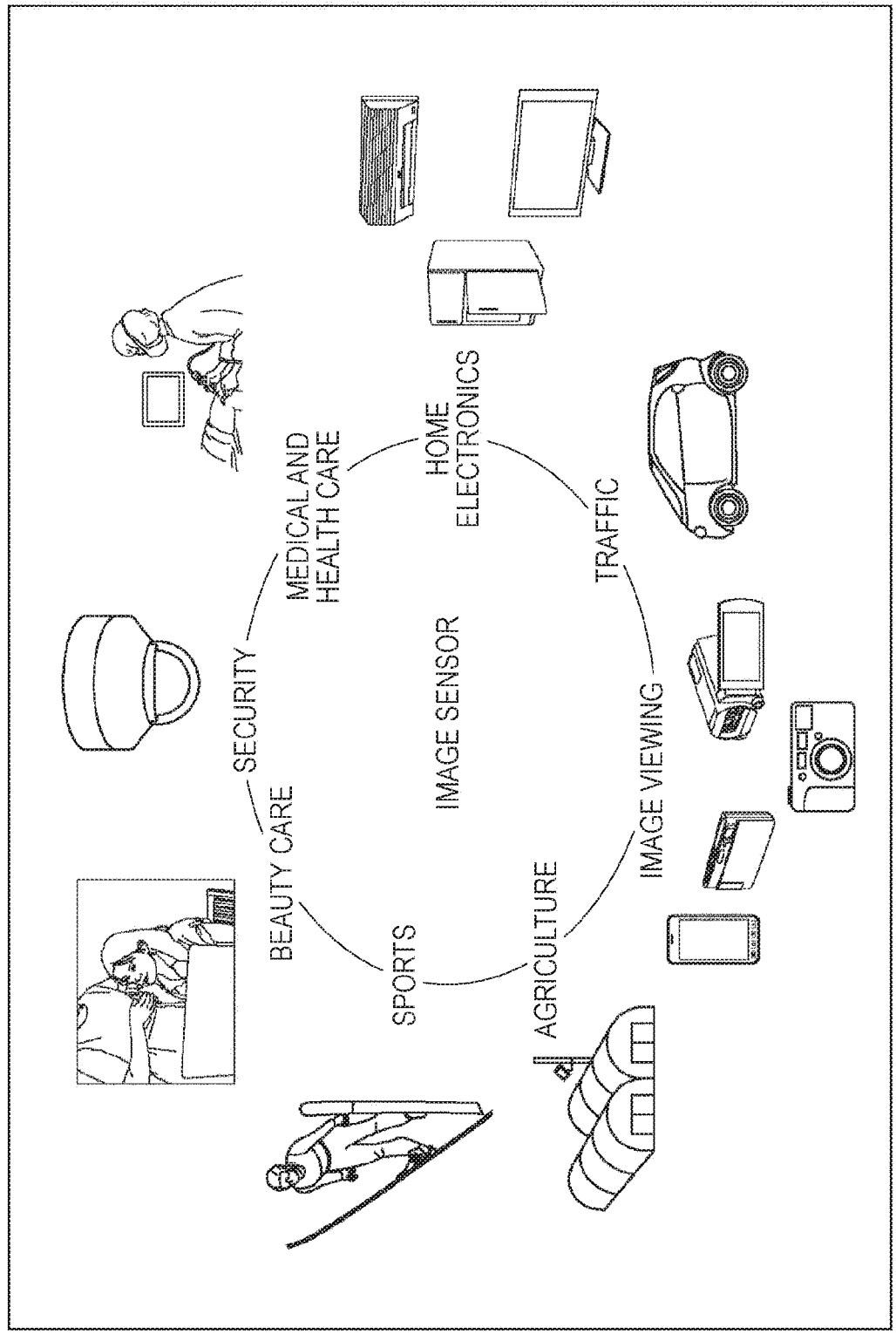
FIG. 12 is a diagram illustrating exemplary uses of an image sensor.

FIG. 12 is a diagram illustrating exemplary uses in which the above-described image sensor (imaging element) is used.

For example, the above-described image sensor can be used in various cases of sensing light such as visible light, infrared light, ultraviolet light, or X-rays, as described below.

- Device adapted to capture an image provided for image viewing, such as a digital camera, a portable device, or the like incorporated with a camera function
- Device provided for traffic in order to achieve safety operation such as automatic stop, recognition of condition of an operator, or the like, and examples of the device including an on-vehicle sensor that captures images of a front side, a rear side, a periphery of a vehicle, a vehicle interior, and the like, a monitoring camera that monitors a traveling vehicle and a road, a ranging sensor that measures an inter-vehicle distance and the like, and the like
- Device provided for home electronics such as a television, a refrigerator, and an air conditioner in order to capture images of gestures of a user and operate the electric appliances in accordance with the gestures.
- Device provided for medical and health care, such as an endoscope or a device that captures images of blood vessels by receiving infrared light
- Device provided for security, such as a monitoring camera for crime prevention or a camera for person authentication
- Device provided for beauty care, such as skin measurement instrument that captures images of the skin or a microscope that captures images of scalp
- Device provided for sports and the like, such as an action camera or a wearable camera used for sports
- Device provided for agriculture, such as a camera to monitor condition of fields and crops.

<Exemplary Combination of Configurations>

Note that the present technology may also have the following configurations.

(1)

A solid-state imaging element including:

a through electrode that connects a first substrate side and a third substrate side in a manner passing through a semiconductor layer of a second substrate of a laminated structure in which the first substrate, the second substrate, and the third substrate are laminated;

a light-blocking film arranged in a wiring layer included in the second substrate and provided on the third substrate side, and having an opening opened to allow the through electrode to pass through; and a contact electrode formed on a bonded surface between the second substrate and the third substrate and used to connect the through electrode to the third substrate side.

(2)

The solid-state imaging element recited in (1) described above, in which the opening formed in the light-blocking film has a diameter smaller than the contact electrode in a plan view of the solid-state imaging element.

(3)

The solid-state imaging element recited in (1) or (2) described above, in which an insulation film having a refractive index different from a refractive index of the wiring layer of the second substrate is formed closer to the contact electrode side than the light-blocking film.

(4)

The solid-state imaging element recited in any one of (1) to (3) described above, in which an insulation film having a refractive index different from a refractive index of the wiring layer of the second substrate is formed in a manner covering a side surface of the through electrode.

(5)

The solid-state imaging element recited in any one of (1) to (4) described above, in which an insulation film having a refractive index different from a refractive index of the wiring layer of the second substrate is provided on the third substrate side of a bonded surface between the second substrate and the third substrate.

(6)

The solid-state imaging element recited in any one of (1) to (5) described above, in which an insulation film having a refractive index different from a refractive index of the wiring layer of the second substrate is provided on the third substrate side of the light-blocking film in a manner laminated on the light-blocking film.

(7)

The solid-state imaging element recited in any one of (1) to (6) described above, further including a light-blocking electrode formed at a portion where the through electrode is formed on a surface facing the third substrate side and included in the semiconductor layer of the second substrate, in which the light-blocking electrode has a shape larger than the opening formed in the light-blocking film.

(8)

The solid-state imaging element recited in any one of (1) to (7) described above, in which a moth-eye structure including a pattern is formed on surface facing the third substrate side and included in the semiconductor layer of the second substrate, and the pattern includes fine irregularities provided at regular intervals.

(9)

The solid-state imaging element recited in any one of (1) to (8) described above, in which the through electrode is formed in a tapered shape having a diameter broadened toward the third substrate.

(10)

A manufacturing method performed by a manufacturing device that manufactures a solid-state imaging element including:

a through electrode that connects a first substrate side and a third substrate side in a manner passing through a semiconductor layer of a second substrate of a laminated structure in which the first substrate, the second substrate, and the third substrate are laminated;

a light-blocking film arranged in a wiring layer included in the second substrate and provided on the third substrate side, and having an opening opened to allow the through electrode to pass through; and a contact electrode formed on a bonded surface between the second substrate and the third substrate and used to connect the through electrode to the third substrate side, the manufacturing method including:

bonding the first substrate and the second substrate;

forming the wiring layer of the second substrate by: depositing an insulation film to be the wiring layer of the second substrate with a predetermined film thickness or less; and depositing the light-blocking film on an entire surface of the insulation film; and then depositing an insulation film until a predetermined film thickness is obtained;

opening the opening in the light-blocking film, and forming the through electrode in a manner passing through the opening, and then forming the contact electrode on a surface of the wiring layer of the second substrate in a manner connected to the through electrode; and bonding the second substrate and the third substrate.

(11)

An electronic apparatus including a solid-state imaging element including:

a solid-state imaging element having a laminated structure in which a first substrate, a second substrate, and a third substrate are laminated;

a through electrode that connects the first substrate side and the third substrate side in a manner passing through a semiconductor layer of the second substrate;

a light-blocking film arranged in a wiring layer included in the second substrate and provided on the third substrate side, and having an opening opened to allow the through electrode to pass through; and a contact electrode formed on a bonded surface between the second substrate and the third substrate and used to connect the through electrode to the third substrate side.

Note that the embodiment of the present disclosure is not limited to the above-described embodiment, and various kinds of modifications can be made within a scope not departing from the gist of the present disclosure. Furthermore, note that the effects described in the present specification are only examples and not limited thereto, and other effects may be provided as well.

REFERENCE SIGNS LIST

11 Solid-state imaging element
12 Memory substrate
13 Logic substrate
14 Sensor substrate
21 Semiconductor layer
22 Wiring layer
31 Wiring layer
32 Semiconductor layer
33 Wiring layer
41 Wiring layer
42 Semiconductor layer
43 On-chip lens layer
51 Wiring
52 Electrode
53 Through electrode
54 and 55 Contact electrode
56 Electrode
57 Light-blocking metal film
Opening
58 Insulation film
61 Light-blocking electrode
63 Moth-eye structure

The invention claimed is:

1. A solid-state imaging element, comprising:
a first substrate;
a second substrate that includes a semiconductor layer and a wiring layer;
a third substrate;
a through electrode configured to connect a substrate side of the first substrate and a substrate side of the third substrate in a manner passing through the semiconductor layer of the second substrate, wherein the solid-state imaging element has a laminated structure in which the first substrate, the second substrate, and the third substrate are laminated;
a light-blocking film in the wiring layer included in the second substrate, wherein
the light-blocking film is on the substrate side of the third substrate, and
the light-blocking film has an opening to allow the through electrode to pass through; and
a contact electrode on a bonded surface between the second substrate and the third substrate, wherein
the contact electrode is configured to connect the through electrode to the substrate side of the third substrate, and
the opening of the light-blocking film has a diameter smaller than the contact electrode in a plan view of the solid-state imaging element.

2. The solid-state imaging element according to claim 1, further comprising an insulation film having a refractive index different from a refractive index of the wiring layer of the second substrate, wherein the insulation film is closer to the contact electrode than the light-blocking film.

3. The solid-state imaging element according to claim 1, further comprising an insulation film having a refractive index different from a refractive index of the wiring layer of the second substrate, wherein the insulation film covers a side surface of the through electrode.

4. The solid-state imaging element according to claim 1, further comprising an insulation film having a refractive index different from a refractive index of the wiring layer of the second substrate, wherein
the insulation film is on the substrate side of the third substrate, and
a surface of the insulation film corresponds to the bonded surface between the second substrate and the third substrate.

5. The solid-state imaging element according to claim 1, further comprising an insulation film having a refractive index different from a refractive index of the wiring layer of the second substrate, wherein the insulation film is on the substrate side of the third substrate with respect to the light-blocking film in a manner laminated on the light-blocking film.

6. The solid-state imaging element according to claim 1, further comprising a light-blocking electrode at a portion where the through electrode is on a surface that faces the substrate side of the third substrate, wherein
- the surface is a surface of the semiconductor layer of the second substrate, and
- the light-blocking electrode has a shape larger than the opening of the light-blocking film.

7. The solid-state imaging element according to claim 1, further comprising a moth-eye structure including a pattern on a surface that faces the substrate side of the third substrate, wherein
- the surface is a surface of the semiconductor layer of the second substrate, and
- the pattern includes fine irregularities at regular intervals.

8. The solid-state imaging element according to claim 1, wherein a shape of the through electrode is a tapered shape having a diameter broadened toward the third substrate.

\* \* \* \* \*